(12) United States Patent
Ruckerbauer (10) Patent No.: US 7,957,209 B2
(45) Date of Patent: Jun. 7, 2011

(54) METHOD OF OPERATING A MEMORY APPARATUS, MEMORY DEVICE AND MEMORY APPARATUS

(75) Inventor: Hermann Ruckerbauer, Moos (DE)

(73) Assignee: Qimonda AG, Munich (DE)

( * ) Notice: Subject to any disclaimer, the term of this patent is extended or adjusted under 35 U.S.C. 154(b) by 147 days.

(21) Appl. No.: 12/180,814

(22) Filed: Jul. 28, 2008

(65) Prior Publication Data

US 2009/0040861 A1 Feb. 12, 2009

(30) Foreign Application Priority Data

Aug. 6, 2007 (DE) .................. 10 2007 036 989

(51) Int. Cl.
*G11C 7/00* (2006.01)
*G11C 8/00* (2006.01)
(52) U.S. Cl. ............... 365/191; 365/230.01; 365/230.03; 365/230.08
(58) Field of Classification Search .................. 365/191, 365/230.01, 230.03, 230.08, 23.03
See application file for complete search history.

(56) References Cited

U.S. PATENT DOCUMENTS

| | | | |
|---|---|---|---|
| 5,111,386 A * | 5/1992 | Fujishima et al. | 711/118 |
| 5,483,497 A | 1/1996 | Mochizuki et al. | |
| 5,959,930 A * | 9/1999 | Sakurai | 365/230.03 |
| 6,038,634 A * | 3/2000 | Ji et al. | 711/5 |
| 6,072,743 A * | 6/2000 | Amano et al. | 365/230.03 |
| 6,088,292 A * | 7/2000 | Takahashi | 365/233.14 |
| 6,246,630 B1 * | 6/2001 | Hosokawa et al. | 365/230.06 |
| 6,674,684 B1 | 1/2004 | Shen | |
| 7,123,497 B2 | 10/2006 | Matsui et al. | |
| 2002/0110037 A1 * | 8/2002 | Fukuyama | 365/230.03 |
| 2004/0190352 A1 * | 9/2004 | Watanabe et al. | 365/191 |
| 2005/0044302 A1 | 2/2005 | Pauley et al. | |

* cited by examiner

*Primary Examiner* — Ly D Pham
(74) *Attorney, Agent, or Firm* — Edell, Shapiro & Finnan, LLC (57) ABSTRACT

A memory apparatus includes at least two memory devices, each memory device including at least one memory bank. A method of operating the memory apparatus includes receiving a row activation command generated by a memory controller, wherein the row activation command includes a bank address. The method also includes activating a word line in a bank of one of the memory devices based on the row activation command, wherein the bank address is used to select the memory device.

15 Claims, 12 Drawing Sheets

| DDR2: | Ballout | BA | Row | Page | Col |
|---|---|---|---|---|---|
| 1G | A15 | 3 | 14 | 1k | 11 |
| 2G | A15 | 3 | 15 | 1k | 11 |
| 4G | A15 | 3 | 16 | 1k | 11 |
| 8G | | | | | |

| DDR3: | BA | Row | Page | Col |
|---|---|---|---|---|
| 1G | 3 | 14 | 1k | 11 |
| 2G | 3 | 15 | 1k | 11 |
| 4G | 3 | 16 | 1k | 11 |
| 8G | 3 | 16 | 2k | 12 |

METHOD OF OPERATING A MEMORY APPARATUS, MEMORY DEVICE AND MEMORY APPARATUS

CROSS REFERENCE TO RELATED APPLICATIONS

This application claims priority under 35 U.S.C. §119 to Application No. DE 102007036989.3 filed on Aug. 6, 2007, entitled "Method for Operating a Memory Apparatus, Memory Device and Memory Apparatus," the entire contents of which are hereby incorporated by reference.

BACKGROUND

The memory requirement for today's applications and appliances is increasing continuously. At the same time, it is important for the memory chips used to be able to operated at a high data rate. This concerns the internal architecture and external signals, for example.

SUMMARY

A memory apparatus and a method of operating the memory apparatus which allows for a high memory performance level at a high speed are described herein. Furthermore, details of a memory device and a memory module are also described herein. The above and still further features and advantages of the present invention will become apparent upon consideration of the following definitions, descriptions and descriptive figures of specific embodiments thereof, wherein like reference numerals in the various figures are utilized to designate like components.

While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below with reference to accompanying drawings, where.

DETAILED DESCRIPTION

In the following paragraphs, embodiments of the device, apparatus and method are described in connection with the figures. It is to be understood that the embodiments of the invention and the features thereof which are described below can be combined with one another arbitrarily in each case, i.e., there is no restriction to the effect that certain features which are described in connection with one particular embodiment cannot be combined with features which are described in connection with another embodiment.

Figure 1:
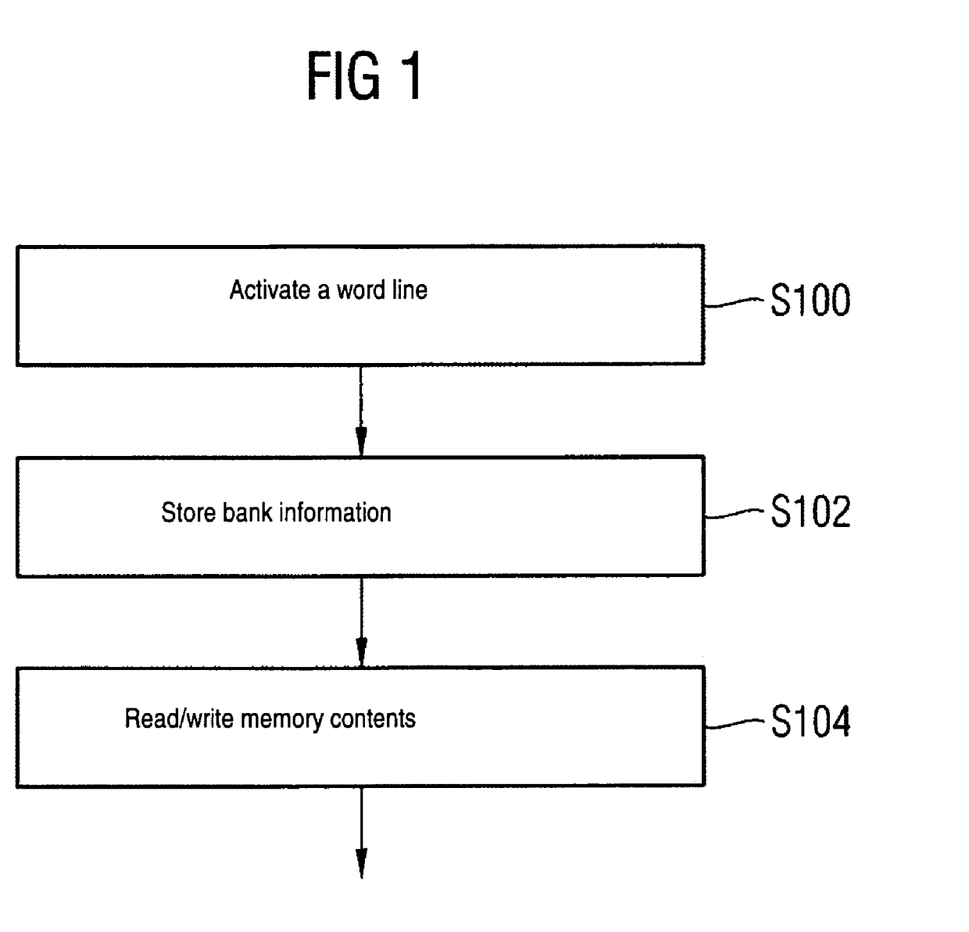
FIG. 1 shows a flowchart for a method of operating a memory apparatus based on one embodiment of the described method.

FIG. 1 shows a flowchart for a method of operating a memory apparatus, in which a word line is activated in a step S100. For example, the memory apparatus may comprise a plurality of memory devices or memory chips which may be arranged in a stack (e.g., a stack arrangement). First, a word line in a bank prescribed by a row activation command (row activate command) is activated. The row activation command may therefore contain a bank address and a row address, for example, the bank address indicating the bank and the row address indicating the row within a bank.

In a step S102, a piece of bank information is stored, the bank information indicating which bank or banks per memory device contain(s) a word line activated by the row activation command. For example, the bank information may thus contain solely the bank address of the last row activation command or a plurality of bank addresses. The bank information may also reveal that no bank in the respective memory device contains a word line activated by the row activation command.

In a step S104, memory contents are read from banks with activated word lines on the basis of the bank information and/or memory contents are written to banks with activated word lines on the basis of the bank information. Accordingly, it is possible for the bank information to be stored until reading/writing (e.g., with auto-precharge) takes place, which is initiated via a column command (column read/write command), for example.

The row activation command may contain a predetermined number of row address bits, a predetermined subset of the row address bits being able to determine a particular memory device in which a word line is activated. For example, the row address bits may be identified by A0 to A16 on the basis of an addressing standard (e.g., JEDEC standard). The upper row address bits (e.g., A14 to A16) may be intended for addressing the respective memory device. For example, in one embodiment, a memory device could have a size of 1 gigabit and the memory apparatus could comprise eight 1 gigabit memory devices with row addresses A0-A13. In this case, addressing the 8 memory devices would require three address bits (e.g., A14 to A16). In another example, only four 1 gigabit memory devices or memory chips could be present. In this case, only two bits (e.g., A14 and A15) would be required for addressing.

The method could also comprise a further step, in which a column command is received which contains a bank address indicating the respective bank from which the memory contents need to be read, and to which memory contents need to be written. The column command (column read/write command) may contain column address bits (e.g., A0 to A9/A11) and bank address bits (e.g., BA0 to BA2), based on a predetermined standard (e.g., JEDEC standard).

According to another embodiment, the column command could be received and decoded by every memory device. In this case, every memory device could use the stored bank information to check whether the respective memory device's bank addressed by the bank address of the column command contains an activated word line. In this embodiment, the reading and/or writing therefore involve(s) data being read from a respective bank and/or written to a respective bank only if the bank information indicates that, in the respective memory device, the respective bank indicated by the bank address of the column command contains an activated word line. This makes it possible to prevent invalid data from being output to a data bus (DQ) connected to the memory apparatus, or data being overwritten, even though every memory device receives and decodes the column command.

According to another embodiment, it is possible for every memory device to store only a portion of the bank information, the respective portion indicating which banks in the respective memory device contain an activated word line. In the case of memory chips with 8 banks, for example, every memory device could store 8 bits.

Figure 2:
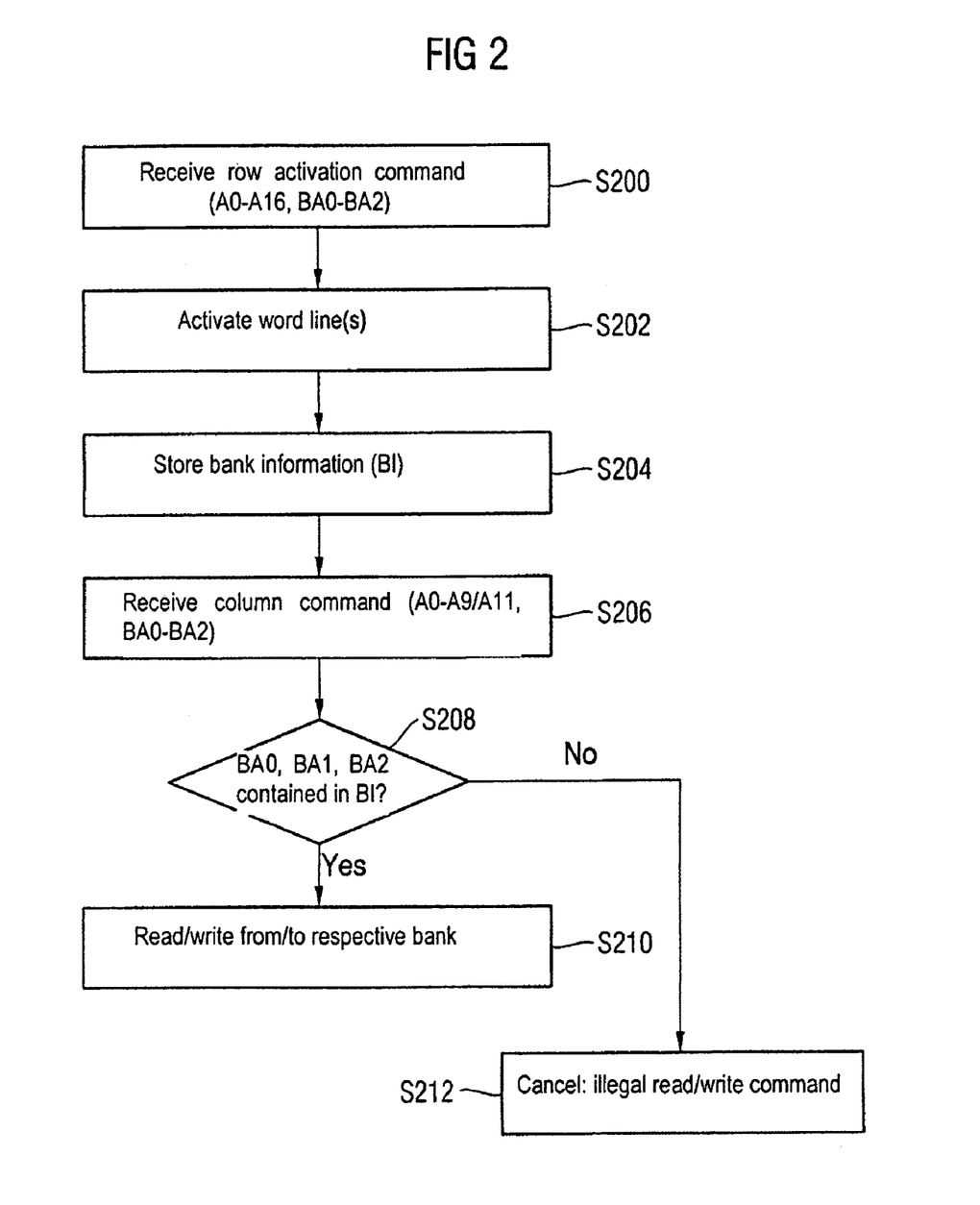
FIG. 2 shows another flowchart based on another embodiment of the described method.

FIG. 2 shows another flowchart based on another embodiment of the method.

In step S200, a row activation command (row command) is received which contains address bits A0 to A16 and bank address bits BA0 to BA2.

Based on the row activation command, a word line in a bank of a memory apparatus is activated, the memory apparatus comprising at least two memory devices, and each memory device including at least one bank. In one embodiment, the memory devices may each include, for example, the same number of banks (e.g., eight banks) which can be addressed by the bank address bits BA0 to BA2. A prescribed portion of the row address bits A0 to A16 (e.g., A14, A15, and A16) can indicate which memory device is addressed. Within a bank, only one word line can ever be activated. However, a plurality of row commands can be used to open a plurality of word lines in different banks simultaneously. Therefore, the bank address bits BA0 to BA2 in the memory apparatus indicate that only one first bank of a memory device at a time can contain an activated word line, and only one second bank at a time and so on. In other words, only one first, second, . . . eighth bank at a time can contain an activated word line, the prescribed portion of the row address bits A0 to A16 (e.g., A14, A15 and A16) stipulating which memory device contains the respective bank.

In step S202, the word line is then activated according to the row activation command.

In step S204, bank information BI is stored, the bank information BI indicating which banks per memory device contain a word line activated by the row activation command. If a memory device contains a first bank and a fifth bank with an activated word line, for example, the bank information could have the following form: 10001000.

In step S206, a column command is received which may contain column address bits A0 to A9/A11 and bank address bits BA0 to BA2, for example. The column command can also indicate whether read or write access needs to take place. The column command does not need to contain the address bits A14-A16 which one of the memory devices selects.

In step S208, the stored bank information BI is used by every or at least one memory device to check whether the bank address of the column command corresponds to an opened bank. In other words, a check is performed to determine whether the bank address (BA0, BA1, BA2) of the column command is contained in the bank information (BI), wherein the bank address (BA0, BA1, BA2) addresses precisely one bank, whereas the bank information (BI) indicates which banks contain opened or activated word lines. If the bank address (BA0, BA1, BA2) of the column command corresponds to an opened bank, appropriate read and/or write access is effected in step S210. If this is not the case, an illegal read/write command has been determined and accordingly, the action is cancelled in step S212. Since, as presented above, only one first bank of all the memory devices at a time may contain an active word line, for example, two memory units are prevented from executing the column command.

Figure 3:
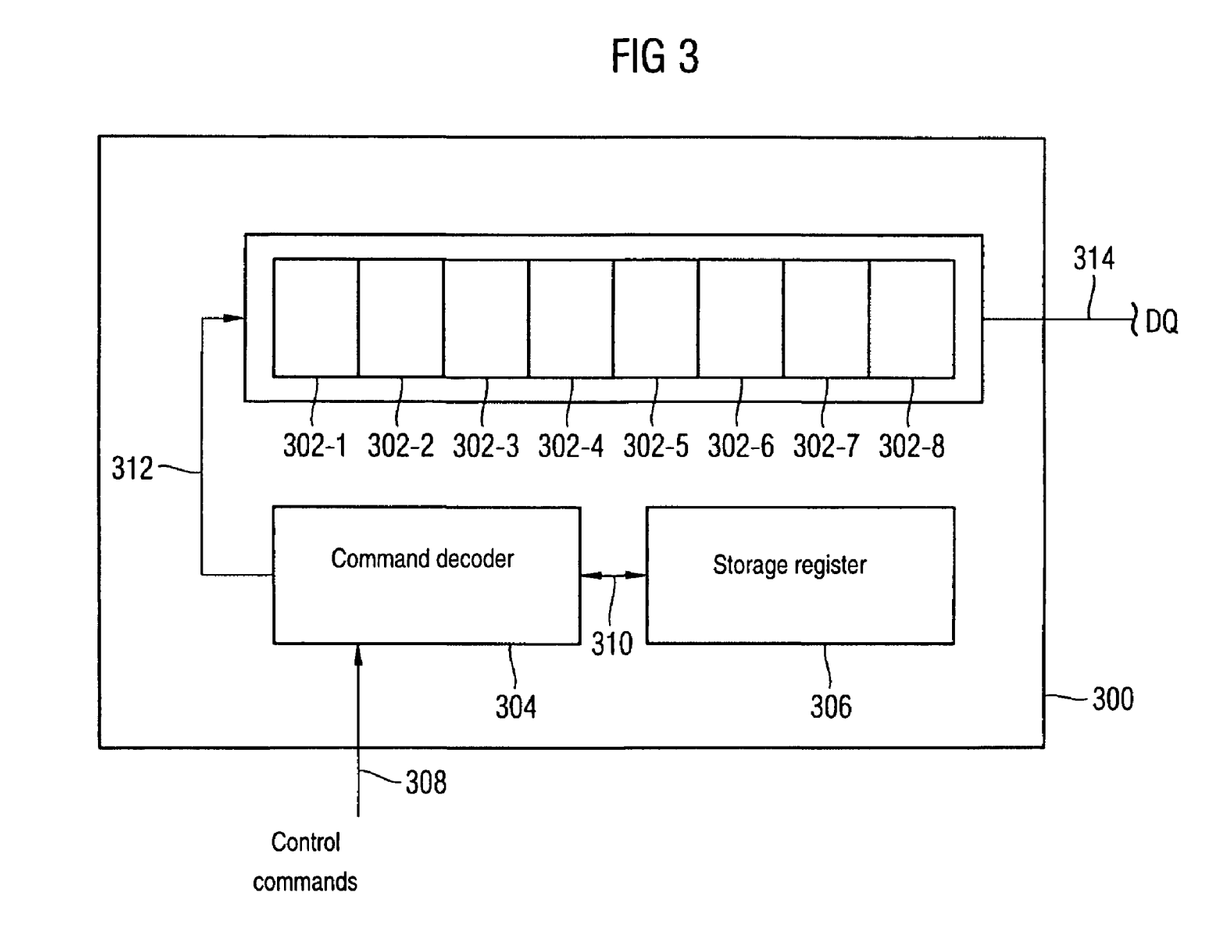
FIG. 3 shows an embodiment of the described memory device.

FIG. 3 shows an embodiment of a memory device 300, which comprises eight banks 302-1 to 302-8 and also a command decoder 304 and a storage register 306.

Access to the memory device 300 is controlled via a first control signal 308, the first control signal 308 being transmitted via a CA bus and/or a control bus, for example. Apart from command signals (RAS, CAS, WE), the CA bus can transmit row and column address bits A0 to A16 and A0 to A9/A11, for example, and the control bus can transmit a CS signal (Chip Select signal), ODT signal (On Die Termination signal) and/or CKE signal (Clock Enable signal).

The command decoder 304 can activate a word line in one of the banks based on a row activation command, which the first control signal 308 may contain. In addition, the command decoder 304 can read memory contents from banks with activated word lines and write them to banks with activated word lines, specifically based on bank information, the bank information indicating which banks contain a word line activated by the row activation command. The bank information can be transmitted from the command decoder 304 to the storage register 306 by a bank information signal 310 and can be stored in the storage register and also retrieved therefrom.

In one development of the embodiment, when a row activation command has been received, the bank information can remain stored in the storage register 306 until the word line is closed, for example, by a precharge command.

For example, the command decoder 304 can use the bank information stored in the storage register 306 to check whether the bank addressed by the bank address of the column command includes an activated word line.

The size of the storage register 306 may be dependent on the number of banks 302-1 to 302-8. In the embodiment shown in FIG. 3, eight banks 302-1 to 302-8 are provided. The size of the storage register may be eight bits. The storage register 306 can therefore be used to store which of the eight banks 302-1 to 302-8 has an activated or opened word line.

Figure 4:
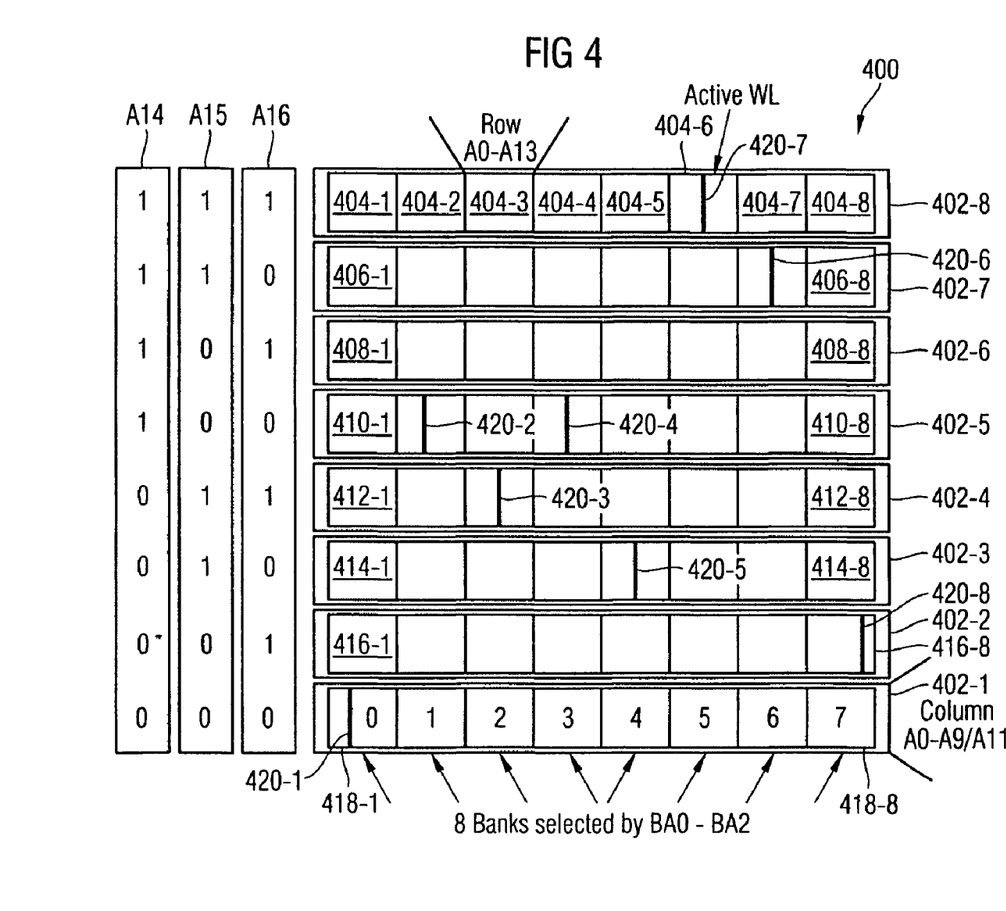
FIG. 4 shows an embodiment of the described memory apparatus.

FIG. 4 shows a memory apparatus 4 which comprises eight memory devices 402-1 to 402-8. For example, a memory device 402 may be a memory chip which provides a memory size of 1 gigabit. Each memory device 402-1 to 402-8 comprises memory banks 404 to 418, each memory device 402 respectively comprising eight memory banks 404-1, . . . , 404-8, . . . , 418-1, . . . , 418-8.

When a row activation command is received, one word line within a particular bank of a particular memory device can be activated as follows: the row activation command includes row address bits A0 to A16 and bank address bits BA0 to BA2, for example. The memory apparatus 400 is configured such that a portion of the row address bits A0 to A16 (e.g., A14, A15 and A16 of FIG. 4) are used for addressing a particular memory device 402-1, . . . , 402-8. For example, the fifth memory device 402-5 can be selected by setting A14, A15, A16 to "100". The other row address bits A0 to A13 are used for selecting a particular word line within a bank. A bank is selected by the bank address bits BA0 to BA2.

The example in FIG. 4 shows eight activated word lines 420-1 to 420-8, the addressing described ensuring that only a single word line 420-1 is activated in all the first banks 404-1, . . . , 418-1. Similarly, only a single word line 420-2 is activated in all the second memory banks 404-2, . . . , 418-2. The same applies to the respective third to eighth memory banks 404-3, . . . , 418-3, 404-4, . . . , 418-4, 404-5, . . . , 418-5, 404-6, . . . , 418-6, 404-7, . . . , 418-7, 404-8, . . . , 418-8.

A controller or memory controller which accesses the memory apparatus 400 therefore only ever "sees" a first, second, . . . , eighth bank, the controller not noticing that these may be banks in different memory devices 402-1 to 402-8.

In this context, memory controller is understood to mean an apparatus which converts a request from the processor into commands or addresses based on the DRAM protocol.

The information regarding which word lines are activated is stored as bank information. For this, each memory device 402-1 to 402-8 may include a respective eight-bit storage register which respectively stores which bank or which banks contain(s) a word line activated by the row activation command.

When a column command is received, the bank information is then used to prevent invalid memory access operations. For example, the column command includes column addresses A0 to A9/A11 and bank address bits BA0-BA2. The column command (column read/write command) is executed by an internal controller for a memory device, for example, when tRCD has elapsed.

In this case, the bank address bits BA0 to BA2 of the column command are compared with the stored bank information. For this, each memory device 402-1 to 402-8 may receive and decode a column command. If the bank address BA0 to BA2 of the column command addresses a bank with an activated word line, the read/write access operation is valid. Otherwise the read/write access operation is invalid.

Figure 5:
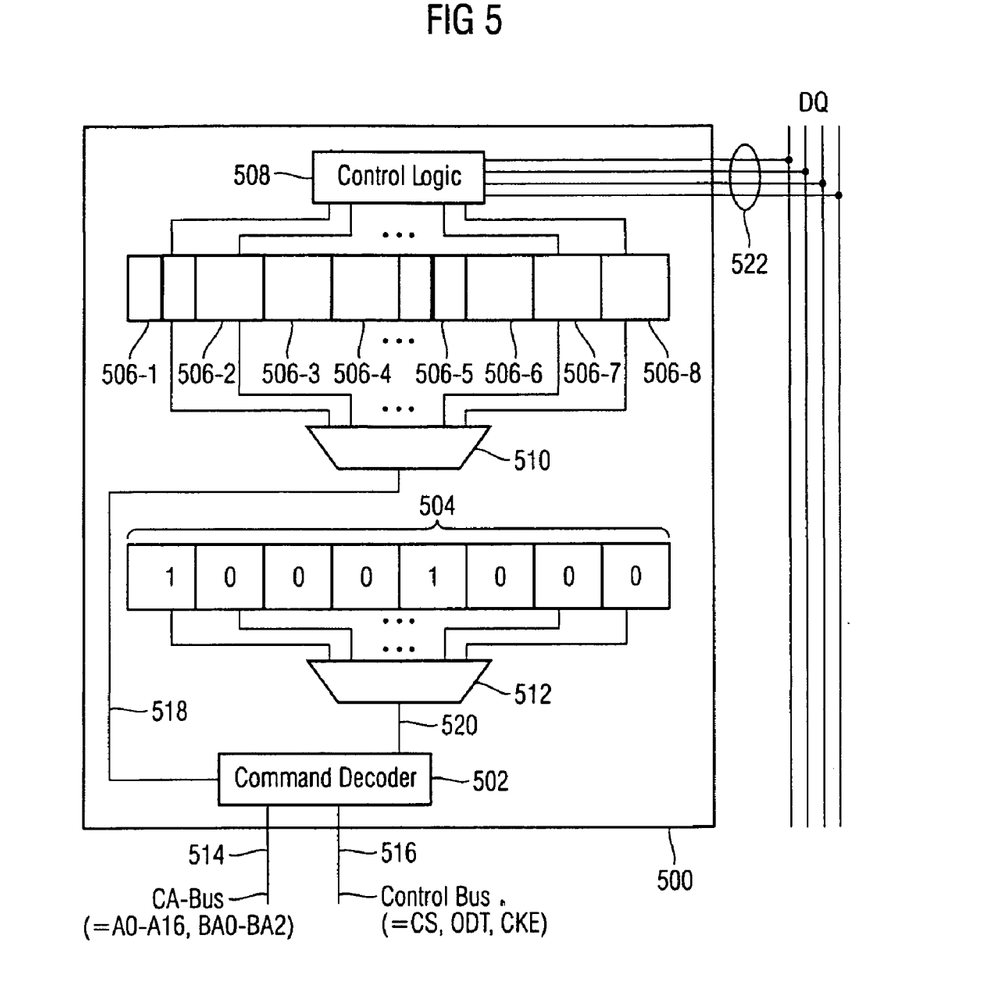
FIG. 5 shows another embodiment of the described memory device.

FIG. 5 shows an embodiment of a memory device 500 which can be included in a stack arrangement, for example. The memory device 500 may have a size of 1 gigabit, for example, with eight such memory devices respectively being able to be combined in a stack, so that a memory chip is produced which has a size of eight gigabits.

The memory device 500 comprises a command decoder 502, a storage register 504, eight banks 506-1, . . . , 506-8 and a control logic chip 508.

Via a CA bus 514, an external memory controller provides the command decoder 502 with row and/or column addresses, commands (RAS/CAS/WE), and bank addresses BA0-BA2. In addition, the command decoder 502 receives the signals CS (Chip Select), ODT (On Die Termination), CKE (Clock Enable) via a control bus.

During memory access, the command decoder 502 receives, for example first of all, a row activation command which includes a row address prescribed by A0 to A16 and a bank address prescribed by BA0 to BA2. Next, the command decoder 502 receives a column command which includes the address bits A0 to A9/A11 to address a column.

In the example in FIG. 5, the command decoder 502 receives a row activation command which activates a word line in the first bank 506-1, for example, while a word line has already been addressed in the fifth bank 506-5. The information regarding in which bank a respective word line is activated is stored in the register 504. As a result, the memory device 500 "knows" or is able to determine upon receiving a column command whether it is permitted to access a particular bank.

The register 504 or the banks 506-1 to 506-8 is/are controlled by appropriate selectors 510 and 512.

The command decoder 502 of each memory device also checks the row activation command as to whether it has actually been addressed. For this, the address bits A14, A15, A16 are used, for example. In other words, only for a particular value of the address bits A14, A15, A16 is a word line in one of the banks 506 actually activated. In FIG. 5, it could be the fifth memory device in a stack, for example. This stack could be addressed for A14, A15, A16="100", for example. In this case, for example, the memory device would use the other values A0-A13 and BA0, BA1, BA2 to activate an appropriate word line only if A14, A15, A16="100".

When a column command is received, the command decoder 502 checks whether the bank address which the column command contains is one which is included in the bank information (BI) stored in the register 504. If so, access to the data bus DQ is permitted via the signal lines or signals 522. The appropriate access control can be performed by the control logic circuit 508, for example.

Figure 6:
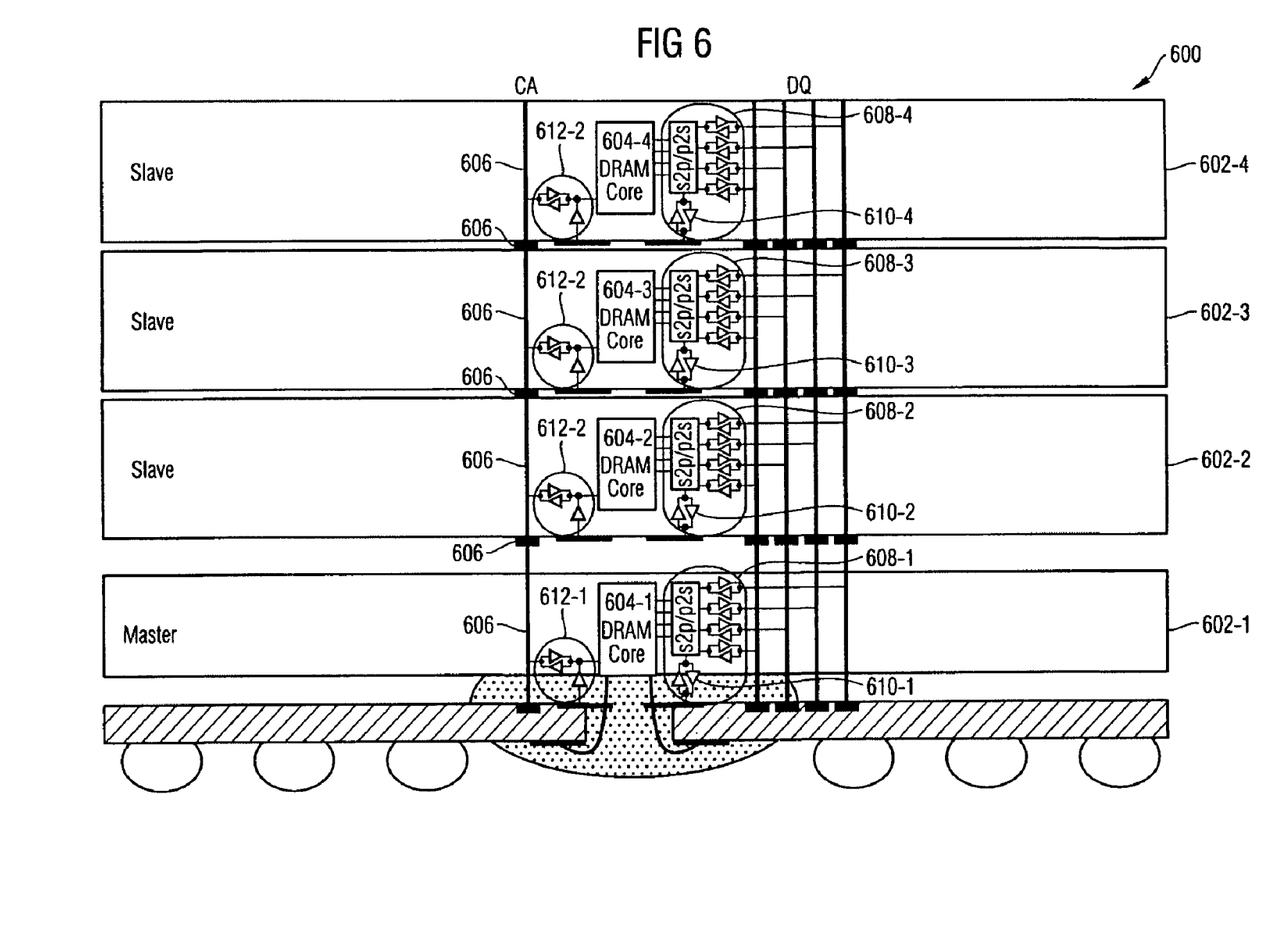
FIG. 6 shows another embodiment of the described memory apparatus.

FIG. 6 shows a memory apparatus 600 which includes a stack arrangement comprising memory devices or memory chips 602-1 to 602-4. The memory apparatus 600 is also called a DRAM stack. The bottom memory device 602-1 in the stack is a master memory device and the other memory devices 602-2, 602-3 and 602-4 are slave memory devices. Each of the memory devices 602-1 to 602-4 comprises a respective piece of control logic 608-1 to 608-4. The control logic 608 controls the respective access to the data bus DQ. The control logic 608 comprises a respective tristate buffer 610, but the tristate buffers 610-2, 610-3, 610-4 of the slave memory devices 602-2, 602-3 and 602-4 could also be dispensed with, since they are not required for slave memory devices.

The memory devices 602-1 to 602-4 are connected to one another by one or more through silicon via (TSV) 606.

Each memory chip 602 contains a DRAM core 604 which, for example, comprises the banks described above etc.

In addition, the memory devices 602-1 to 602-4 include further control logic 612, which contains tristate buffers, inter alia. This means that a memory device can be set either as a master or as a slave. The further control logic 612-1 is set or configured such that the memory device 602-1 operates as a master. Commands received are thus distributed or forwarded via the TSV 606. The further control logic 612-2 of the memory devices 602-2, 602-3 and 602-4 is set such that these memory devices operate as slaves.

Figure 7:
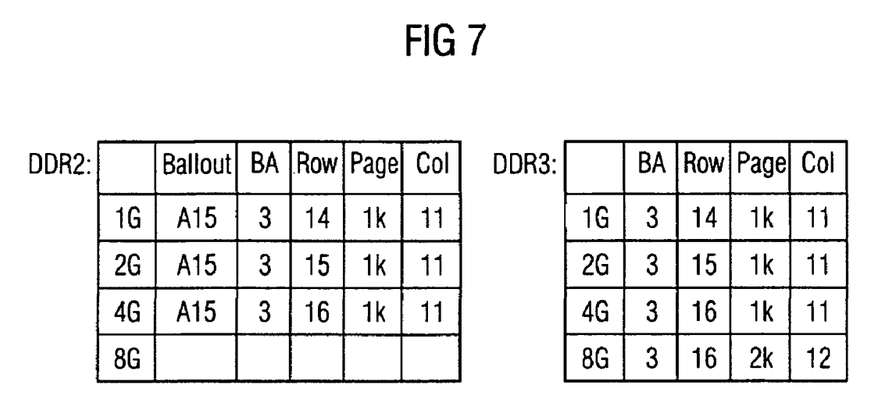
FIG. 7 shows an example of an addressing scheme.

FIG. 7 shows an example of an addressing scheme for a DDR2 memory and a DDR3 memory. As indicated in FIG. 7, the address bits A14 and A15 are used for addressing a 4-gigabit memory, for example.

Figure 8:
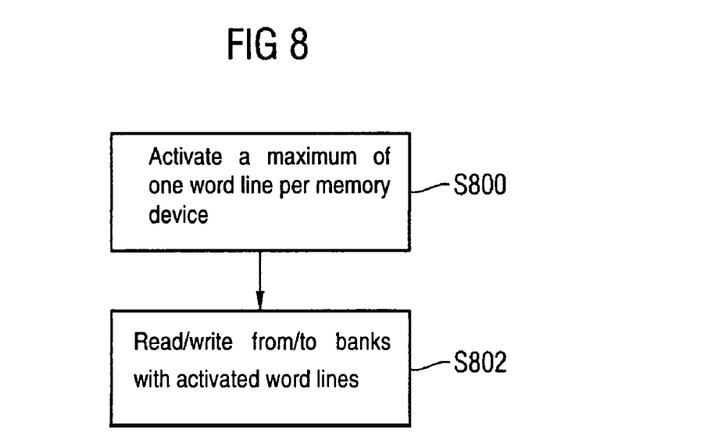
FIG. 8 shows another flowchart for another embodiment of the described method of operating a memory apparatus.

FIG. 8 shows another embodiment of a method of operating a memory apparatus which comprises at least two memory devices, each memory device including at least one bank or memory bank. For example, the memory apparatus may be a stack arrangement comprising a plurality of memory devices or memory chips or semiconductor memory devices, with a DRAM core being able to be arranged on each memory device, for example.

In step S800, a word line in a bank is activated based on a row activation command. In this case, a maximum of one word line per memory device or memory chip is activated. Next, in step S802, memory contents are read from banks with activated word lines based on a column command, or memory contents are written to banks with activated word lines.

So that in the case of an 8-gigabit stack arrangement, for example, a maximum of one word line per memory device is activated, one embodiment of the memory apparatus may have row address connections of the memory device connected to bank address connections of a controller used for addressing. The controller may be a standard controller (e.g., a controller typically usually used for actuating DRAM memories).

In line with one embodiment, bank address connections of the memory device may be connected to row address connections of the controller. In other words, it is possible for a controller to transmit a row address to the memory apparatus, the wiring of the memory apparatus being arranged such that the row address transmitted by the controller is regarded by the memory device as a bank address. In addition, the wiring of the memory apparatus allows a bank address transmitted from the controller to the memory apparatus to be used as a row address for a memory device. In this case, the portion of the row address is not used as a row address, for example, but rather as a memory device address. These are additional addresses which the individual memory device would not have.

In another embodiment, the row activation command may comprise a row address and a bank address, for example. A portion of the row address (e.g., A14, A15 and A16 based on the JEDEC standard) is then used by a memory device to address a bank within the memory device, as a result of the "interchanged" wiring. The bank address (e.g., BA0, BA1 and BA2 based on the JEDEC standard) generated by the controller can be used to address a particular memory device in the memory apparatus. In the case of an 8-gigabit stack arrangement comprising one-gigabit memory devices, the memory apparatus accordingly behaves as though a memory device corresponds to a bank.

The bank address (e.g., BA0, BA1, BA2) generated by a controller, for example, can accordingly be used to select or address a memory device in which a word line is activated in a respective bank. In this connection, the word line is selected or addressed by the row address bits (e.g., A0 to A13 based on the JEDEC standard).

In other words, a row activation command is provided by a controller or memory controller, the memory controller actually intending to use a bank address to select a bank. In fact, the memory controller uses a bank address to select a memory device or a particular memory chip, however. Secondly, the row address which is generated by the controller and is included in the row activation command is used to select a bank in a memory device selected by the bank address.

The row address may include a first address portion (e.g., A0 to A13) and a second address portion (e.g., A14 to A16) the second address portion A14 to A16 being used to select the respective bank.

The first address portion A0 to A13 can be used to select a word line in a bank selected by the second address portion (A14 to A16).

In line with another embodiment, at least one portion of the row activation command can be stored, for example, at least up until receipt of a precharge command which is used to close or deactivate the word line again.

The stored portion of the row activation command may be the aforementioned second address portion (A14 to A16).

Figure 9:
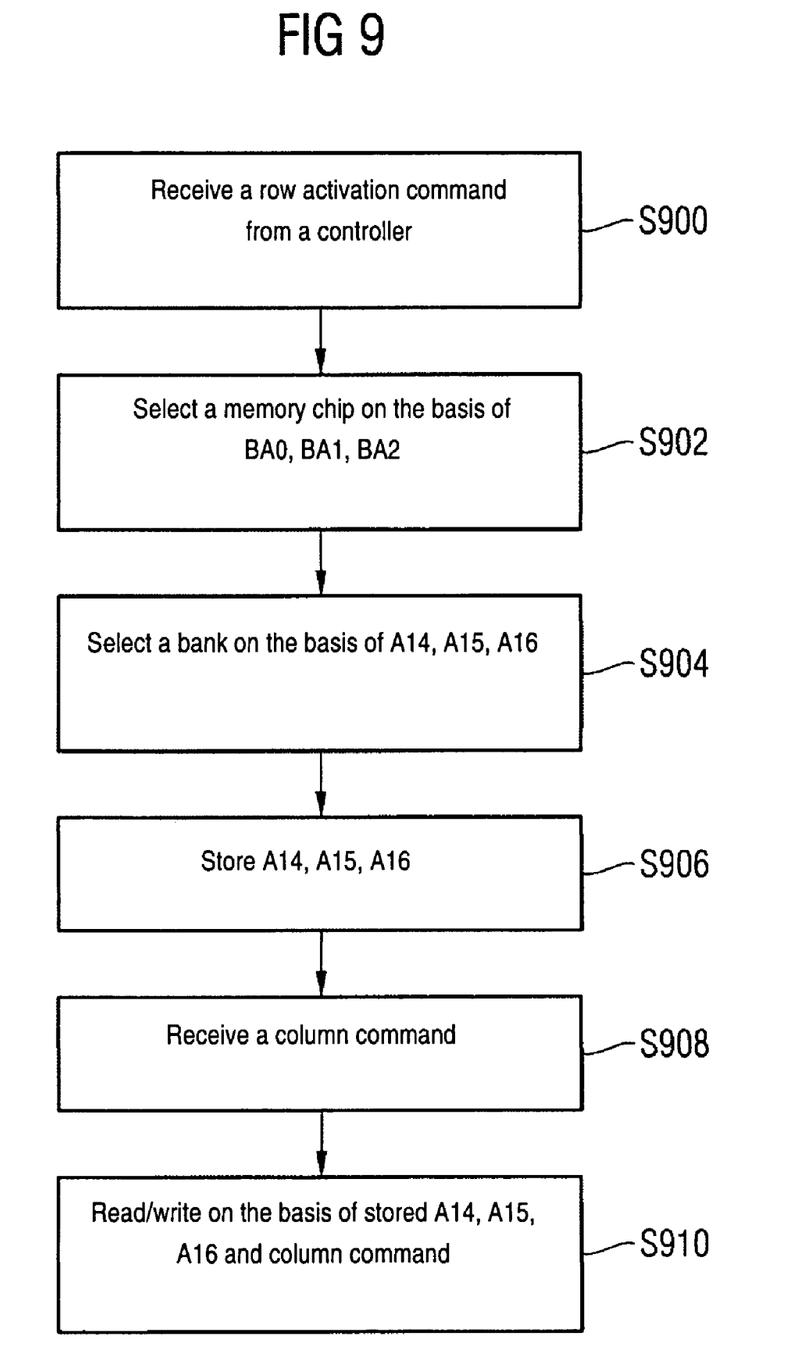
FIG. 9 shows yet another flowchart for another embodiment of the described method.

FIG. 9 shows another embodiment of the method of operating a memory apparatus, wherein the method includes receiving a row activation command from a controller in step S900.

In step S902, a memory chip is selected based on the bank addresses (e.g., BA0, BA1 and BA2 based on the JEDEC standard) generated by the controller. It is therefore possible for only one memory chip selected by BA0, BA1 and BA2 to be "activated". That is to say, only if a particular memory chip is addressed by BA0, BA1 and BA2 does this selected chip decode a row activation command and/or subsequent column command completely. This allows power to saved, for example. Power is also saved by virtue of only one word line per chip being able to be activated, for example.

In step S904, a bank in the memory chip selected by BA0, BA1 and BA2 is addressed based on A14, A15 and A16.

In step S906, the values of A14, A15 and A16 of the row activation command are stored. In step S908, a column command (e.g., A0 to A9/A11 based on the JEDEC standard) is received.

In step S910, the column command from step S908 is first of all evaluated in so far as it is established which memory chip is addressed by the bank address which the column command contains. That is to say that, in another embodiment of the method, the reading/writing also involves a memory chip being accessed only if it is selected or addressed by the bank address of the column command.

In order to establish from which bank within the memory chip addressed by BA0, BA1, BA2 of the column command information needs to be read and/or to which bank information needs to be written, the stored values of A14, A15 and A16 are used. That is to say that memory contents are read from banks and/or written to banks which are stipulated by the stored values of A14, A15 and A16. To activate a memory or registers which store the values A14, A15, A16 of the row activation command, it is possible to use the command bus signals RAS (Row Address Strobe), CAS (Column Address Strobe) and/or WE (Write Enable), for example. Alternatively and/or in addition, it is also possible to use the control bus signals CS (Chip Select), ODT (On Die Termination) and/or CKE (Clock Enable).

Figure 10A:
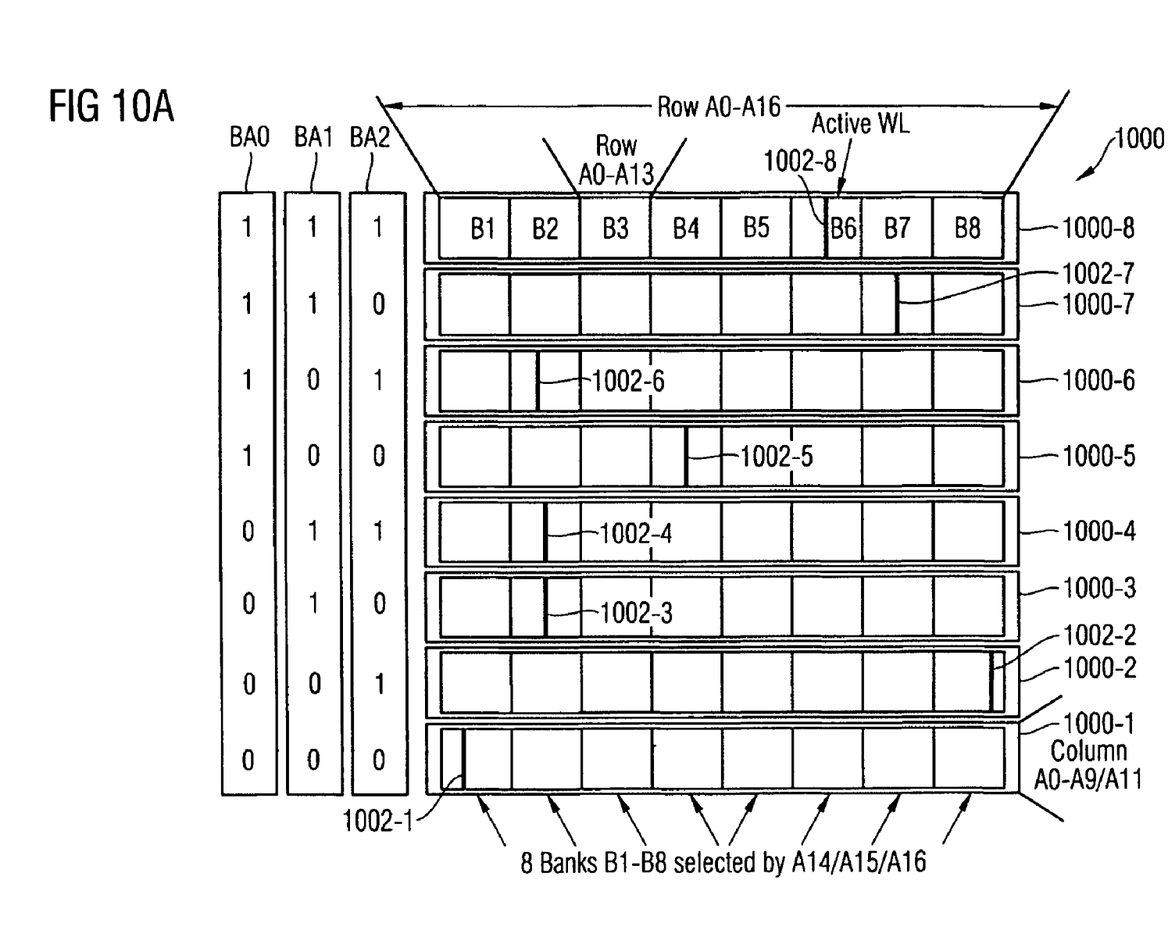
FIG. 10A shows another embodiment of the described memory apparatus.

FIG. 10A shows a memory apparatus 1000. The memory apparatus 1000 comprises eight memory devices 1000-1, . . . , 1000-8. By way of example, the memory devices 1000-1 to 1000-8 may be arranged in a housing in a stack arrangement, with contact being made by means of balls. The memory devices 1000-1 to 1000-8 may be connected to one another by one or more through silicon via (TSV), for example.

The wiring of the memory apparatus 1000 may be chosen such that a bank address BA0, BA1, BA2 provided by a memory controller selects one of the eight memory devices 1000-1, . . . , 1000-8. Since the bank address (e.g., BA0, BA1, BA2 based on the JEDEC standard) is provided by the memory controller both for a row activation command (row command) and for a column command (column read/write command), the described addressing or activation of a memory device is possible both when a row activation command is received and when a column command is received.

Accordingly, a bank address BA0, BA1, BA2 provided by the memory controller does not, in reality, select or address any bank within a memory device, but rather one of the memory devices 1000-1, . . . , 1000-8. For example, a bank address BA0, BA1, BA2=011 can select the fourth memory device 1000-4.

Based on the JEDEC standard, the row activation command contains the row addresses A0 to A16 and a bank address BA0, BA1 and BA2, for example. As already described, the bank address BA0, BA1, BA2 selects a particular memory device 1000. A portion of the row address A0, . . . , A16 addresses a bank within the memory device selected by BA0, BA1, BA2. For example, A14, A15, A16="010" can select a third bank B3 in a memory device. The other row address bits A0 to A13 of the row address are used to select and activate a particular word line within the bank addressed by A14, A15, A16.

In other words, in the embodiment shown in FIG. 10A, a bank address provided by a controller selects a memory device 1000, and a portion of the row address (e.g., A14, A15 and A16) selects a bank within the selected memory device 1000.

The activated word lines are identified by reference symbols 1002-1, 1002-8 in FIG. 10A. The result of the association between BA0, BA1, BA2 and memory devices is that a maximum of one word line 1002 can be activated by a memory device, since the controller "sees" only one bank per memory device.

Following execution of a row activation command, a subsequent column command can be processed. For example, the column command contains a column address (e.g., A0, ..., A9/A11) and a bank address (e.g., BA0, BA1, BA2). When the column command is processed, the bank address BA0, BA1, BA2 in turn addresses a memory device 1000. The column address A0, ..., A9/A11 activates an appropriate column in a bank with an activated word line 1002, so that an appropriate memory content is read.

To prevent a column command from involving access to a bank without an activated word line, the values A14, A15, A16 of the row activation command are stored in a register, for example. For this, a storage register can be provided in each memory device 1000, for example, and in the embodiment shown in FIG. 10A the size of the storage register is 3 bits, for example, so that the information regarding which of the eight banks contains an activated word line can be stored.

In the case of the memory apparatus 1000, it is possible that not every memory device 1000 needs to decode a row activation command and/or an appropriate column command completely, since decoding possibly needs to take place only when a memory device 1000 is addressed by BA0, BA1, BA2.

Figure 10B:
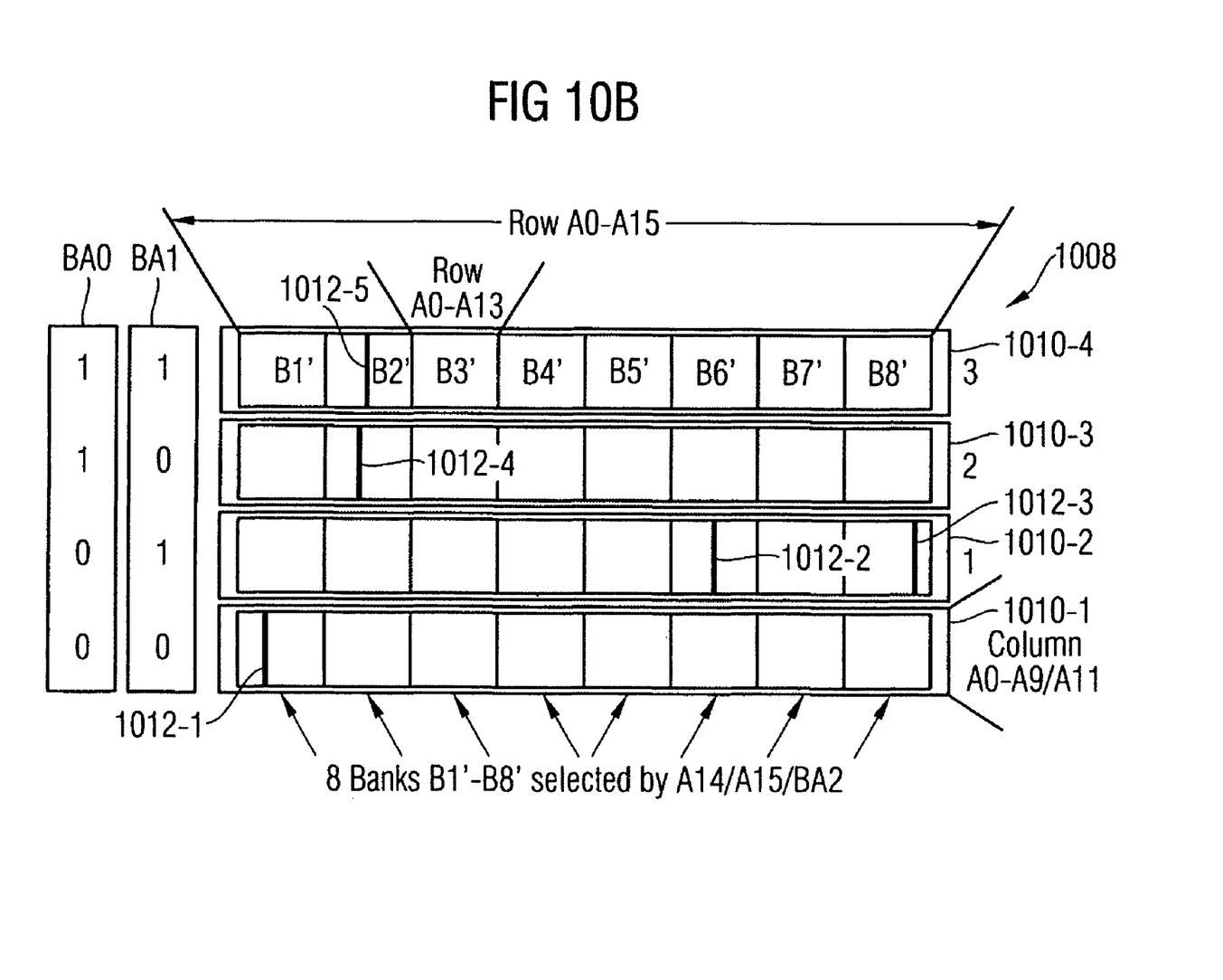
FIG. 10B shows yet another embodiment of the described memory apparatus.

FIG. 10B shows yet another embodiment of a memory apparatus 1008. The memory apparatus 1008 comprises four memory devices 1010-1 to 1010-4 which may have a respective size of 1 Gbit, for example. The size of the memory apparatus 1008 is thus 4 Gbits. In the embodiment shown in FIG. 10B, only the bank addresses BA0 and BA1 of the row activation command are used for selecting one of the memory devices 1010. That is to say that a memory device 1010 in which a word line needs to be activated is selected by the bank address portions BA0 and BA1 which the row activation command includes.

Within a memory device selected by BA0 and BA1, a bank is selected by the row address bits A14, A15 and also by the bank address bit BA2.

To activate a word line 1012, a portion of the bank address (e.g., bits BA0 and BA2) is thus used for selecting a memory device 1010 and a portion of the row address (e.g., bits A14 and A15) and also a further portion of the bank address (e.g., bit BA2) are used in order to activate a particular bank within the memory device.

In the embodiment in FIG. 10B, it is therefore possible for word lines in two banks to be opened or activated in a memory device 1010 by successive row activation commands.

In the embodiment in FIG. 10B, each memory device 1010 must be used to store only two bits in a register, namely the row address bits A14 and A15.

From FIGS. 10A and 10B, it becomes clear that it is also possible to construct a stack from just two 1-Gbit memory devices, for example. This would involve selection of the memory device by the bank address bit BA0, for example, a respective bank within one of the two memory devices being selected by the row address bit A14, and also the bank address bits BA1 and BA2.

Figure 11:
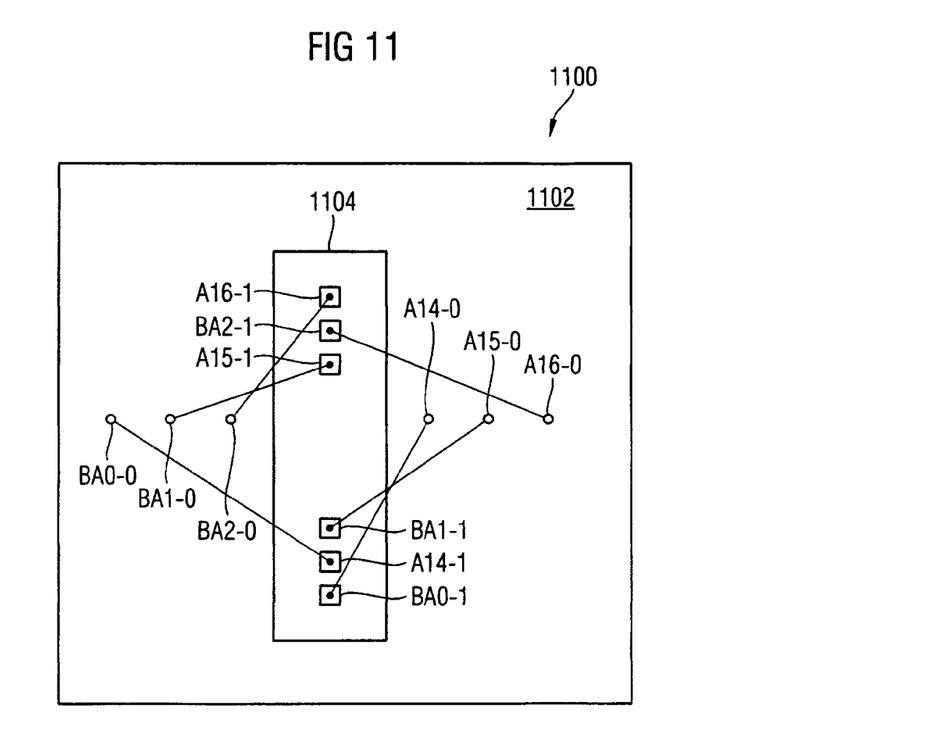
FIG. 11 shows a schematic detail of an embodiment of the described memory apparatus.

FIG. 11 schematically shows an underside 1102 of a memory apparatus 1100 based on another embodiment of the described memory apparatus.

The underside 1102 comprises balls for connecting the memory apparatus 1100. The balls are also called "external connections" of the memory apparatus 1100. The balls are arranged on the basis of the JEDEC standard, for example, so that there is an exact stipulation of that external connection to which a particular signal line of a controller for controlling the memory or for accessing the memory is applied.

For the sake of clarity, FIG. 11 shows only the external connections BA0-0, BA1-0, BA2-0, A14-0, A15-0, A16-0 for a memory device. The external connections BA0-0, BA1-0, BA2-0 are supplied with a bank address by the memory controller. The external connections A14-0, A15-0 and A16-0 are supplied or actuated with the row address bits A14, A15, A16 by the memory controller. The other external address connections A0 to A13 are not shown, for the sake of clarity, as already mentioned.

A detail 1104 shows the address line connections A14-1, A15-1, A16-1 of a memory device, and also the bank address connections BA0-1, BA1-1, BA2-1 of the memory device, for example. The address line connections A14-1, A15-1, A16-1 and bank address connections BA0-1, BA1-1, BA2-1 are the connections of the memory device which have been used base on the JEDEC standard to date for row addressing or bank addressing.

With conventional wiring, the external bank address connections would now be connected to the bank address connections of the memory device (i.e., BA0-0 would be connected to BA0-1 and so on). In addition, the external address line connections A14-0, A15-0, A16-0 would be connected to the row address connections A14-1, A15-1, A16-1 of the memory device.

According to the embodiment of the described memory apparatus in FIG. 11, however, this does not happen. Instead, the external bank address connections are connected to the row address connections of the memory device and the external row address connections are connected to the bank address connections of the memory device.

In other words, according to the embodiment shown in FIG. 11, the following connections are obtained: BA0-0 to A14-1, BA1-0 to A15-1, BA2-0 to A16-1 and A14-0 to BA0-1, A15-0 to BA1-1 and A16-0 to BA2-1.

Therefore, a bank address of the memory controller can be used to select a memory device. In addition, the address bits A14, A15, A16 of a row activation command can select a particular bank within a memory device.

Figure 12:
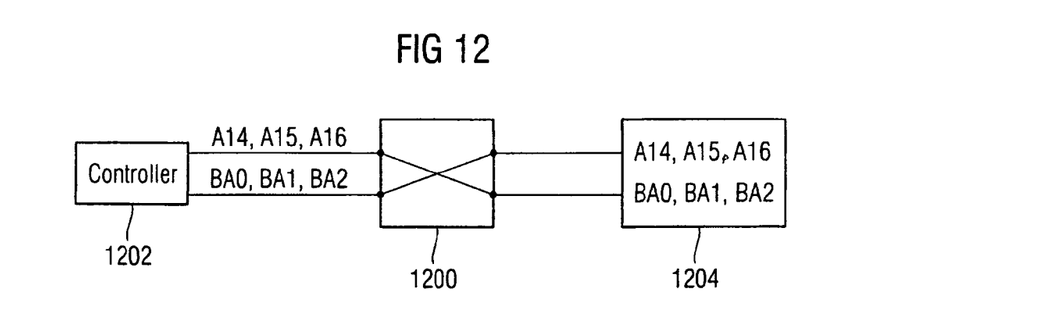
FIG. 12 schematically shows the wiring between a memory controller and a memory device.

FIG. 12 schematically shows crosswise wiring 1200 between a controller 1202 and a memory device 1204, which may be part of a stack arrangement in a memory apparatus, for example.

As illustrated, the "interchanged wiring" means that a bank address BA0, BA1, BA2 generated by a controller 1202 is coupled to the connections A14, A15, A16 of the memory device 1204. In addition, a portion of the row address, i.e., the address lines A14, A15, A16 of the memory controller 1202, is coupled to the bank connections BA0, BA1, BA2 of the memory device 1204.

The interchange of a bank address and a row address can also be achieved via appropriate routing of a DIMM (Dual Inline Memory Module), for example. In this case, the memory apparatus would be wired normally, the memory devices of the memory apparatus including the memories or registers or memory units which have been described. In addition, the interchange could also be provided by an advanced memory buffer (AMB). The advanced memory buffer may be arranged on the DIMM or the motherboard, for example.

Figure 13:
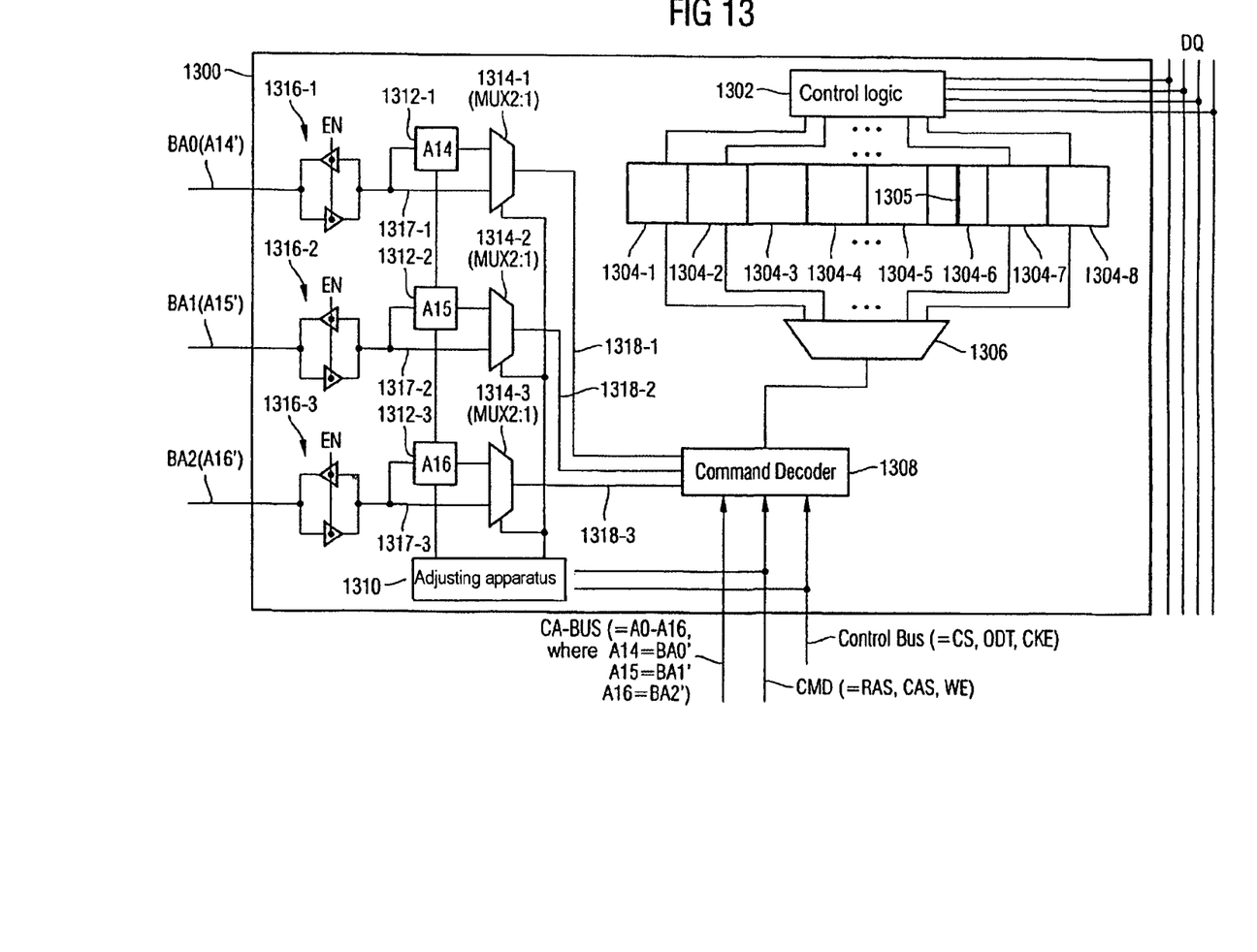
FIG. 13 shows another embodiment of the described memory device.

FIG. 13 shows another embodiment of a memory device 1300. The memory device 1300 comprises a control logic block 1302, banks 1304-1, ..., 1304-8, a selector 1306, a command decoder 1308, an adjusting apparatus 1310, storage registers 1312-1, ..., 1312-3, 2:1 multiplexers 1314-1, ..., 1314-3 and further control logic 1316.

During operation of the memory device 1300, the command decoder 1308 receives a row activation command and/or a column command, for example, via the CA bus, CMD bus and control bus. To access a particular memory content, it is first of all possible to receive and process a row activation command and then a column command, for example.

The row activation command is provided by a memory controller, for example, and includes row address bits A0' to A16' and also a bank address BA0' to BA2'. The bank address BA0', BA1', BA2' generated by the controller is supplied to the memory device 1300 as a row address. That is to say that the bank address BA0', BA1', BA2' provided by the controller is supplied to the connections A14, A15, A16 of the memory device 1300 which are usually used on the basis of the JEDEC standard. In addition, a portion of the row address bits generated by the controller, namely the address bits A14', A15' and A16', is regarded by the memory device 1300 as a bank address, i.e., the address bits A14', A15', A16' generated by the controller are supplied to the bank address lines (identified by BA0, BA1 and BA2 in FIG. 13) which are used based on the JEDEC standard.

The command decoder 1308 can use the values applied to its connections A14, A15, A16 (which values correspond to a bank address BA0', BA1', BA2' generated by the controller) to decide whether the memory device 1300 is addressed. In one embodiment of the invention, it is possible for a command to be decoded only if the command decoder 1308 uses A14, A15, A16 to establish that the memory device 1300 is addressed. This allows power to be saved, for example.

The memory device 1300 is thus connected so that a bank address BA0', BA1', BA2' generated by the controller is applied to the connections A14, A15, A16 of the memory device 1300, and row address bits A14', A15' and A16' generated by the controller are applied to the connections BA0, BA1, BA2 of the memory device. In this case, the connections A14, A15, A16 and BA0, BA1, BA2 correspond to connections which are normally used on the basis of a particular standard (e.g., JEDEC standard) for connecting appropriate row address lines or bank address lines.

The adjusting apparatus 1310 controls the storage registers 1312-1, 1312-2, 1312-3 and the 2:1 multiplexers 1314-1, 1314-2, 1314-3. When a row activation command is received, the adjusting apparatus 1310 sets the storage registers 1312-1, 1312-2, 1312-3 such that the respective signals or values applied to the input are stored ("latched"). That is to say that when a row activation command is received the values which apply to the signals 1317-1, 1317-2, 1317-3 are transferred to the respective registers 1312.

In addition, the adjusting apparatus 1310 sets the 2:1 multiplexers 1314 such that the signals 1317-1, 1317-2, 1317-3 are applied to the output. That is to say that the signals 1318-1, 1318-2, 1318-3 correspond to the signals 1317-1, 1317-2, 1317-3.

When a row activation command is received, the command decoder 1308 thus receives the address bits A14', A15', A16' generated by the controller and, as described above, then regards them as a bank address. That is to say that the "interchanged" wiring allows the command decoder 1308 to use the applied signals A14', A15', A16' to select one of the banks 1304-1, ..., 1304-8. In other words, the address bits A14', A15', A16' generated by the controller allows the command decoder 1308 to use selector 1306 to select a bank 1304 in which a word line is activated. In the example in FIG. 13, the sixth bank 1304-6 is selected.

Within a bank selected by A14', A15', A16', a word line 1305 is selected by the "correctly wired" (i.e., correspondingly wired) address bits A0 to A13. In other words, the address bits A0' to A13' generated by the controller are connected to the "correct" (i.e., corresponding) connections A0 to A13 of the memory device, or those which are normally provided for this purpose.

As described above, the memory device 1300 is selected or activated by the bank address BA0', BA1', BA2' generated by the controller. This can be established by the command decoder 1308. If the command decoder 1308 establishes that the memory device 1300 has been selected or addressed, a bank in which a word line needs to be activated is selected by the address bits A14', A15', A16' generated by the controller.

When a column command is received, the controller does not provide the address bits A14', A15', A16', based on the JEDEC standard. This means that when a column command is received, the adjusting apparatus 1310 sets the 2:1 multiplexers 1314-1, 1314-2, 1314-3 such that the content of a respective storage register 1312-1, 1312-2, 1312-3 is applied to the respective output 1318-1, 1318-2, 1318-3. Accordingly, the command decoder 1308, upon receiving a column command, has the information available regarding which bank contains a word line 1305 activated by the row activation command.

Therefore, when a column command is received, the command decoder 1308 can read memory contents from a bank and/or write them to a bank specifically, the bank including an activated word line.

The control logic block 1302 is then responsible for the data transmission between the banks and a data bus DQ.

The further control logic 1316-1, 1316-2, 1316-3 comprises respective tristate buffers which can be used to set the memory device 1300 as a master memory device or as a slave memory device for use in a stack arrangement (in this regard, see also the description of FIG. 6).

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of operating a memory apparatus with at least two memory devices, each memory device including at least one bank and a storage register, the method comprising:
   receiving a row activation command containing a row address and a bank address that specify a memory device, a bank, and a word line;
   activating the word line in the bank of the memory device specified by the row activation command;
   storing bank information in the storage register indicating the bank specified by the row activation command until the selected bank is closed; and
   reading/writing memory contents from/to the bank with the activated word line via a column command.

2. The method of claim 1, further comprising:
   selecting the bank of the memory device via the row address.

3. The method of claim 2, wherein the row address includes first and second address portions and the bank is selected via the second address portion.

4. The method of claim 3, further comprising:
selecting a word line of the selected bank via the first address portion.

5. The method of claim 1, wherein at least one of: the row activation command and the column command are provided by at least one of: a memory controller and an advanced memory buffer (AMB).

6. The method of claim 1, further comprising:
selecting the memory device via the row address, wherein the row address includes first and second address portions and the memory device is selected via the second address portion.

7. The method of claim 6, further comprising:
selecting the bank of the selected memory device via the bank address.

8. The method of claim 7, further comprising:
selecting the word line of the selected bank of the selected memory device via the first address portion.

9. The method of claim 1, wherein storing bank information in the storage register comprises storing a portion of the row activation command.

10. The method of claim 1, wherein the column command includes bank address bits indicating a bank, the method further comprising:
comparing the bank address bits of the column command to the stored bank information from the row activation command to prevent invalid memory access operations.

11. A method of operating a memory apparatus with at least two memory devices, each memory device including at least one bank and a storage register, the method comprising:
receiving a row activation command containing a row address and a bank address that specify a memory device, a bank, and a word line;
selecting the bank of the memory device via the row address, wherein the row address includes first and second address portions and the bank is selected via the second address portion;
activating the word line in the bank of the memory device specified by the row activation command; and
storing bank information in the storage register indicating the bank specified by the row activation command by storing at least a portion of the row activation command until the selected bank is closed; and
reading/writing memory contents from/to the bank with the activated word line via a column command.

12. The method of claim 11, wherein the stored portion of the row activation command is the second address portion.

13. The method of claim 11, wherein the reading/writing is effected via the stored portion.

14. The method of claim 13, wherein read/write access is effected only from/to a bank with an activated word line, the effected bank being determined via the stored portion.

15. A method of operating a memory apparatus with at least two memory devices, each memory device including at least one bank and a storage register, the method comprising:
receiving a row activation command containing a row address and a bank address that specify a memory device, a bank, and a word line;
selecting the bank of the memory device via the bank address, wherein the row address includes first and second address portions and the memory device is selected via the second address portion;
activating the word line in the bank of the memory device specified by the row activation command; and
storing bank information in the storage register indicating the bank specified by the row activation command by storing at least a portion of the row activation command until the selected bank is closed; and
reading/writing memory contents from/to the bank with the activated word line via a column command.

* * * * *